(12) United States Patent
Liu et al.

(10) Patent No.: US 6,606,244 B1
(45) Date of Patent: Aug. 12, 2003

(54) POINTING DEVICE HAVING COMPUTER HOST

(75) Inventors: Louis Liu, Taipei Hsien (TW); Grace Chang, Taipei Hsien (TW)

(73) Assignee: Saint Song Corp. (TW)

( * ) Notice: Subject to any disclaimer, the term of this patent is extended or adjusted under 35 U.S.C. 154(b) by 0 days.

(21) Appl. No.: 09/394,295

(22) Filed: Sep. 10, 1999

(51) Int. Cl.⁷ .............................. H05K 7/20; G06F 1/20
(52) U.S. Cl. ...................... 361/687; 361/690; 361/692; 361/695; 361/697; 345/163; 345/167
(58) Field of Search ................................ 361/687, 680, 361/681, 682, 683, 685, 679, 686, 690, 692, 695, 697, 736, 752; 345/163–167

(56) References Cited

U.S. PATENT DOCUMENTS

| | | | | |
|---|---|---|---|---|
| 4,980,848 A | * | 12/1990 | Griffin et al. ................ 364/708 |
| 5,251,096 A | * | 10/1993 | Hosoi et al. ................. 361/695 |
| 5,430,609 A | * | 7/1995 | Kikinis ........................ 361/687 |
| 5,448,446 A | * | 9/1995 | Honda et al. ................ 361/680 |
| 5,469,194 A | * | 11/1995 | Clark et al. .................. 345/173 |
| 5,475,564 A | * | 12/1995 | Chiou ........................ 361/704 |
| 5,583,744 A | * | 12/1996 | Oguchi et al. .............. 361/683 |
| 5,646,821 A | * | 7/1997 | Sun ............................. 361/683 |
| 5,650,912 A | * | 7/1997 | Katsui et al. ............... 361/697 |
| 5,694,294 A | * | 12/1997 | Ohashi et al. .............. 361/687 |
| 5,726,684 A | * | 3/1998 | Blankenship et al. ....... 345/167 |
| 5,796,965 A | * | 8/1998 | Choi et al. .................. 395/309 |
| 5,930,376 A | * | 7/1999 | Markow et al. ............ 381/333 |
| 5,982,358 A | * | 11/1999 | Fleming, III ................ 345/168 |

* cited by examiner

*Primary Examiner*—Anatoly Vortman
(74) *Attorney, Agent, or Firm*—Powell Goldstein Frazer & Murphy LLP

(57) ABSTRACT

The present invention discloses a pointing device having a computer host. The present invention comprises a cursor move device for moving the cursor and a command input device for inputting commands to the computer host. Among these, the computer host further includes a mother board, a CPU, a memory and at least one connecting port. Via the connecting ports, user interface such as a display and a keyboard can be connected to the present invention to form a complete computer.

14 Claims, 3 Drawing Sheets

POINTING DEVICE HAVING COMPUTER HOST

BACKGROUND OF THE INVENTION

1. Field of the Invention

The present invention relates to a pointing device, and more particularly to a pointing device having a computer host.

2. Description of the Prior Art

At present, a pointing device becomes an indispensable user interface of a computer because via the pointing device, a user can rapidly move the cursor along any direction to the desired position or menu shown in a display. Then, the user clicks a button, and thereby, input a command to the computer. Due to the described convenience above, several types of pointing device, such as a mouse, a track ball, a mini joystick, a track board and a touch pad, have been designed. Selection and purchase of such several types of pointing device depend on the user's respective requirement.

According to the portable ability, personal computers are classified into a desktop computer and a portable computer. Additionally, the portable computer can be further classified into a notebook computer and a handhold computer. Among these, as shown in FIG. 1(a), the desktop computer 10 is unsuitable for frequently moving because of volume and weight. On the other hand, the notebook computer 20, shown in FIG. 1(b), possesses higher portable ability compared to the desktop computer. However, a bottleneck evidently appears at degrading the notebook computer size because the sizes of user interface, such as a display 12 and a keyboard 14, can not be infinitely reduced. For example, users may feel uncomfortable at visual when looking at a display 12 with too small size. Furthermore, it is not so convenient for use when a keyboard 14 composed of buttons having size smaller than a human's finger.

Therefore, the present invention discloses a pointing device having a computer host to give consideration to the convenience provided by the pointing device and further improvement in the portable ability of the traditional computer host. The present invention is not only a pointing device but also a computer host. It is important to note that the present invention does not include a display and a keyboard so that the volume of the present invention can be reduced significantly.

SUMMARY OF THE INVENTION

The object of present invention is to disclose a pointing device having a computer host. The present invention integrates a pointing device with a computer host into a housing. Therefore, the present invention can serve as a pointing device, besides, and a computer host. It is important to note that the present invention does not include any display and keyboard so that the volume and weight can be reduced significantly. Compared to the traditional portable computer, the present invention possesses higher portable ability. Of course, it is necessary to connect a display and a keyboard to the present invention while use.

The disclosed pointing device having a portable computer host includes a pointing device and a computer host. Among these, the pointing device further includes a cursor move device and a command input device. The functions of the disclosed pointing device are identical to that of the traditional pointing device. For example, via the cursor move device, a user can move a cursor to the desired position or menu shown in a display. Then, the user can select the desired command or menu shown in the display. Via the command input device, the desired command can be input to the CPU of the computer host. Consequently, the CPU responds to the input command to activate the computer.

Additionally, the computer host includes a mother board, a CPU, a memory, at least one port and a housing. Among these, the mother board has an upper surface and a lower surface. The CPU is placed on the upper surface and electrically coupled to the mother board via cables. The auxiliary memory is placed on the upper surface and electrically coupled to the mother board via the cables. The main memory is placed on the lower surface and electrically coupled to the CPU via the cables. Via a socket, the CPU is coupled to the upper surface of the mother board. Additionally, a heat sink is attached to the CPU to dissipate the heat generated by the CPU. At least one connecting port is placed along the peripheries of the mother board. Via the connecting ports, user interfaces such as a display and a keyboard can be connected to the disclosed portable computer.

The above-mentioned pointing device and computer host can be integrated into a housing to form a complete body. In a preferred embodiment, the housing consists of a lower case and an upper case. Among these, the lower case holds the mother board and encapsulates the lower surface. The upper case covers the upper surface of the mother board. Additionally, the upper case has a plurality of air inlets, at least one exhaust outlet, a first opening and at least one second opening. The air inlets of the upper case serve as the intake of fresh air. Via the air inlets, the fresh air is introduced into the CPU by the fan. Then, via the exhaust outlet, the heat generated by the CPU is exhausted. Accordingly, the problem caused by the heat generated by the CPU is solved. By coupling the upper case to the lower case, the mother board and the above elements are sealed. Besides, the first opening and the second opening exposes apart of the cursor move device and a part of the command input device, respectively.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

The present invention discloses a pointing device having a computer host, a housing can be further employed to encapsulate the disclosed pointing device. Therefore, the present invention is not only a pointing device but also a computer host. Additionally, the present invention does not include any display and keyboard so that the volume and the weight can be reduced significantly. Compared to the traditional notebook computer, the present invention possesses higher portable ability.

The present invention includes a pointing device and a computer host. Among these, the pointing device further consists of a cursor move device and a command input device. It is emphasized that the functions of the disclosed pointing device are identical to that of the traditional pointing device. For example, via the cursor move device, a user can move a cursor along any arbitrary direction to the desired position shown in a display. Then, the user can select the desired command or menu shown in the display. Via the command input device, the desired command or menu can be inputted to the CPU of the computer host. Thereby, the CPU responds to the inputted command to activate the computer.

Figure 1:
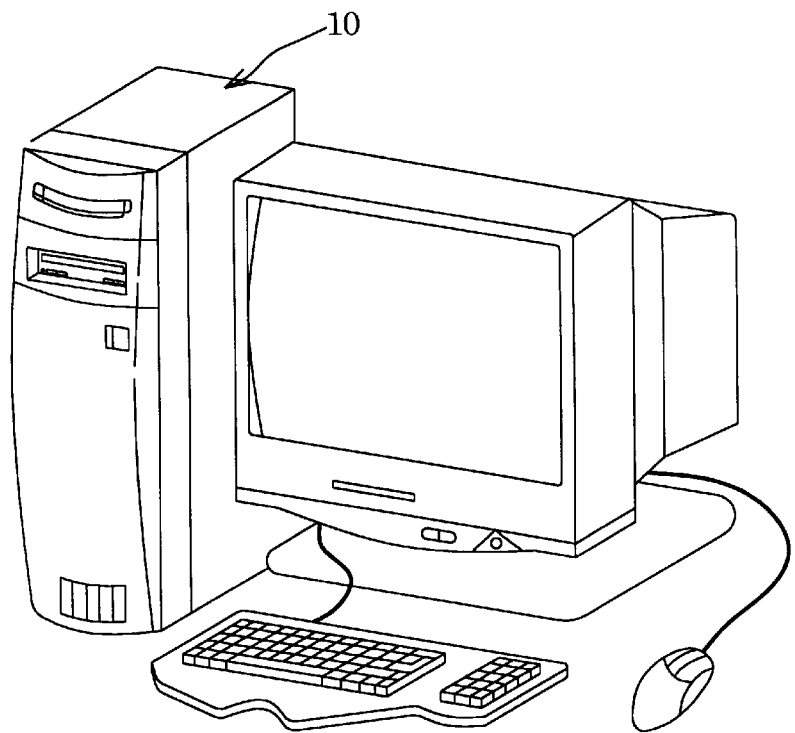
FIG. 1(a) depicts the outline of a traditional desktop personal computer.
FIG. 1(b) depicts the outline of a traditional notebook computer.
Figure 1:
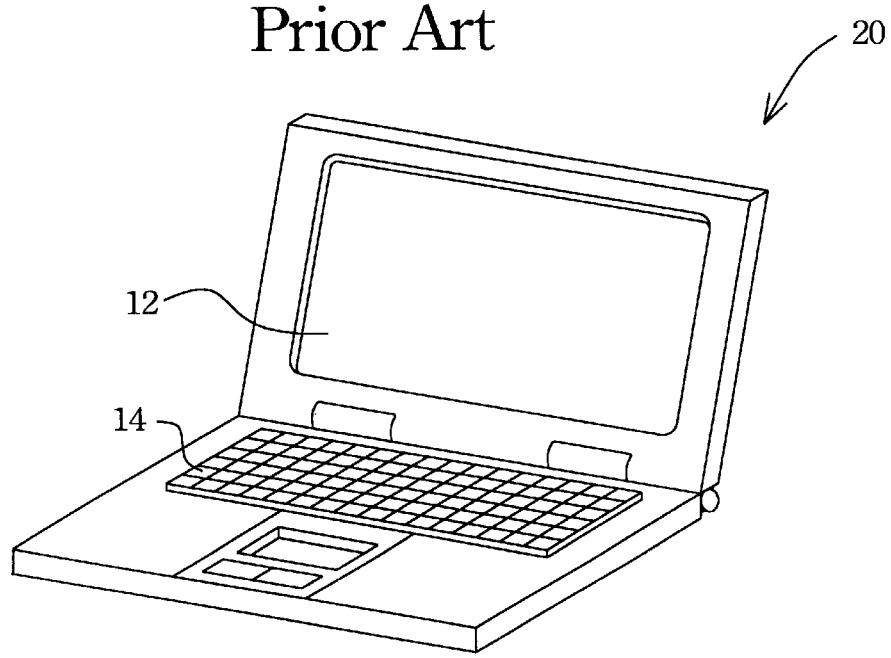
Figure 2:
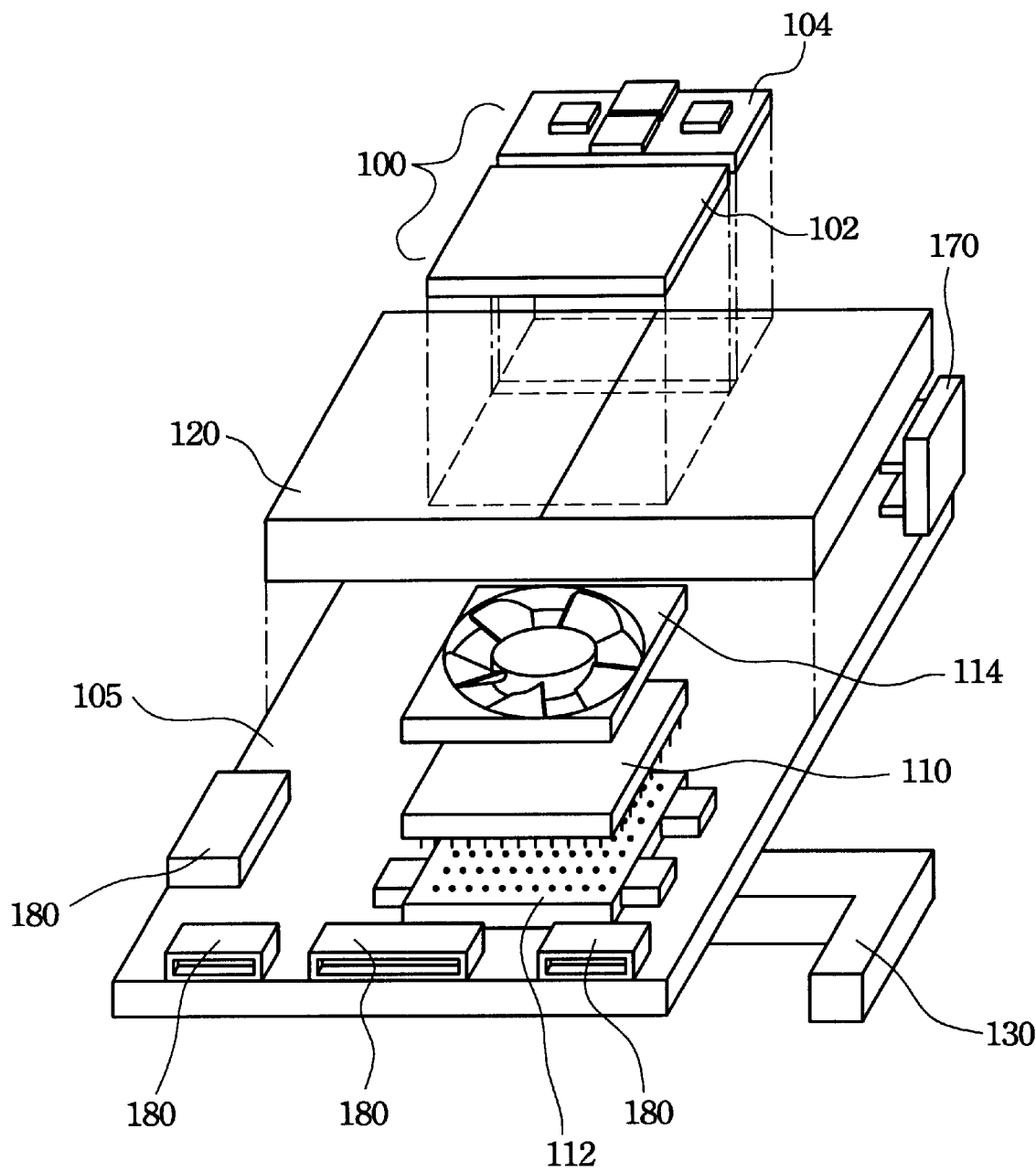
FIG. 2 is an exploded diagram illustrating portions of the elements consisting of the present invention.

The pointing device can be a mouse, a track ball, a mini joystick, a track board or a touch pad. In the preferred embodiment, a touch pad 100 shown in FIG. 2 is selected to illustrate the pointing device. The touch pad 100 is composed of a pad 102 and at least one button 104. Among these, the pad 102 and the buttons 104 serve as the above-mentioned cursor move device and the command input device, respectively. Via the pad 102, the user can move a cursor along any arbitrary direction to the desired position shown in a display. Then, the user can select the desired command or menu shown in the display. Via the buttons 104, the desired command or menu can be inputted to the CPU of the computer host. Consequently, the CPU responds to the inputted command to activate the computer.

Alternatively, a track ball is selected to illustrate the pointing device. The track ball consists of a ball-shaped cursor move device and plural buttons. Via the ball-shaped cursor move device, the user can move the cursor along any arbitrary direction to the desired position shown in the display. Then, the user can select the desired command or menu shown in the display. Via the buttons serving as the command input device, the desired command or menu can be inputted to the CPU of the computer host. Consequently, the CPU responds to the inputted command to activate the computer. The working principle of the other pointing devices is the same with that of the touch pad and track ball above so that the detail description is omitted.

Referring to FIG. 2, the computer host according to the present invention further includes a mother board 105, a central processing unit (CPU) 110, a memory, at least one connecting port 180 and a housing. Among these, the mother board 105 has an upper surface and a lower surface. Both of the upper surface and the lower surface can connect other devices by using cables (not shown). For example, the CPU 110 is placed on the upper surface and electrically coupled to the mother board 105 via the cables. The memory includes an auxiliary memory 120 and a main memory 130. Among these, the auxiliary memory 120 is placed on the upper surface and electrically coupled to the CPU 110 via an auxiliary circuit board 170. Alternatively, the auxiliary memory 120 is electrically coupled to the CPU 110 via the cables. In the preferred embodiment, a hard disk driver is selected as the auxiliary memory 120. Besides, the above-mentioned pointing device 100 is allocated over the auxiliary memory 120 and electrically coupled the CPU 110 via the cable. The main memory 130 is placed on the lower surface and electrically coupled to the CPU 110 via the cables. Note that the functions of the above-mentioned elements are identical to the traditional elements so that the detail descriptions of the functions are omitted.

Still referring to FIG. 2, via a socket 112, the CPU 110 is coupled to the mother board 105. Additionally, a heat sink 114 is attached to the CPU 110 to dissipate the heat generated by the CPU 110. In a preferred embodiment, a fan is selected to serve as the heat sink. At least one connecting port 180 is placed as the periphery along the edges of the mother board 105. Besides, the connecting port 180 and the CPU are on the same side of the mother board 105. The connecting ports 180 can be composed of a USB port, a video port, a PS/2 port, extending ports and a power connector. Via the connecting ports 180, the user interface can be connected to the present invention. For example, by connecting a display and a keyboard to the present invention via the connecting port 180, a computer having complete function is available. Besides, via the connecting ports 180, the periphery devices can be connected to the present invention to expand the functions of the present invention. The periphery devices include a floppy disk driver, a CD-ROM, a printer, a scanner and a digital static camera. For example, via the USB port 180, a floppy disk driver can be electrically coupled to the computer host. Alternatively, via the extending port, a CD-ROM can be electrically coupled to the computer host. It is important to note that the size and the specification of the above elements are the same with that of general or traditional elements. Thus, the cost and the assembly do not burden the present invention.

Figure 3:
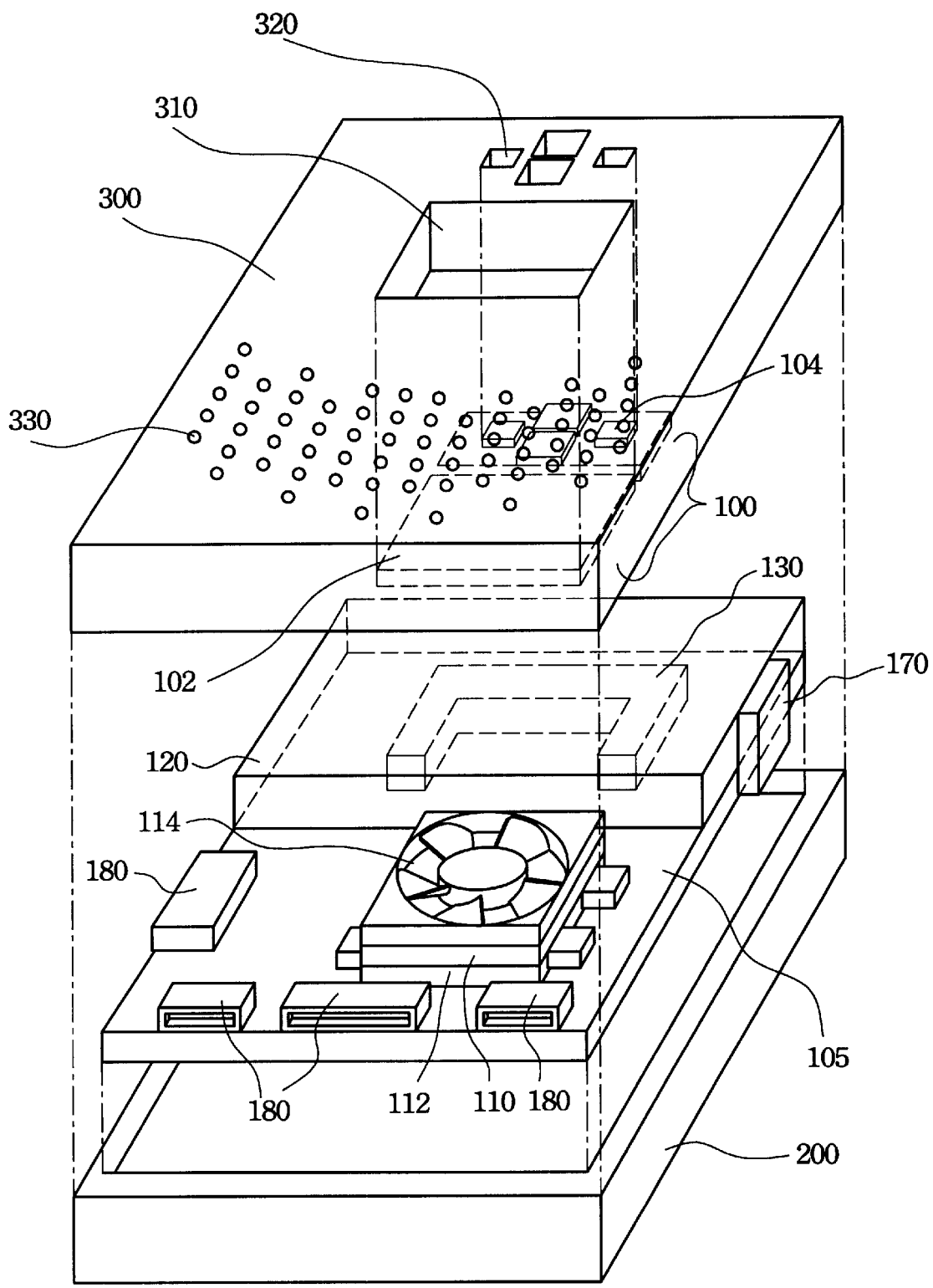
FIG. 3 is an exploded diagram illustrating whole elements consisting of the present invention.

The present invention integrates the above-mentioned pointing device and computer host into the housing to form a complete body. The outline of the housing is not limited. For example, the outline of the housing can be mouse-shaped while a mouse is selected to serve as the pointing device. Alternatively, the housing can be designed as a housing having a flat panel shape, as shown in FIG. 3, while a touch pad is selected to serve as the pointing device. Referring to FIG. 3, the housing includes a lower case 200 and an upper case 300. Among these, the lower case 200 is used to hold the mother board 105 and encapsulate the lower surface. The upper case 300 is used to cover the upper surface of the mother board 105. Additionally, the upper case 300 has a first opening 310, at least one second opening 320, a plurality of air inlets 330 and at least one exhaust outlet (not shown). Among these, the first opening 310 and the second openings 320 expose a part of the above-mentioned cursor move device, such as the pad 102, and a part of the command input device such as the buttons 104, respectively. The air inlets 330 of the upper case 300 serve as the intake of fresh air. To describe it in detail, via the air inlets 330, the fresh air can be introduced into the CPU 110 by the fan 114. Then, via the exhaust outlet, the heat generated by the CPU 110 is exhausted. Accordingly, the problem caused by the heat generated by the CPU 110 is overcome. In the preferred embodiment, the exhaust outlet is formed on the sidewall of the upper case 300. By coupling the upper case 300 to the lower case 200, the mother board 105 and the above elements are sealed. In this preferred embodiment, the length, the width and the thickness of the portable computer host are 6 inches (about 15 cm), 4 inches (about 10 cm) and 1¼ inches (about 3 cm), respectively. According to the size above, the portable computer host indeed possesses higher portable ability compared to traditional computers. However, it is important to note that the person skilled in the art can amend the aforementioned length, the aforementioned width and the aforementioned height according to the spirit of the present invention.

After the present invention is brought from a first position to a second position, a computer with user interfaces can be obtained by connecting the present invention to a display and a keyboard. Meanwhile, a pointing device can be obtained, too. Additionally, because the disclosed computer host is identical, it is not necessary to backup data by an extra assistant storage device.

As is understood by a person skilled in the art, the foregoing preferred embodiments of the present invention are illustrated of the present invention rather than limiting of the present invention. It is intended to cover various modifications, such as the shape of the pointing device, and similar arrangements included within the spirit and scope of the appended claims, the scope of which should be accorded the broadest interpretation so as to encompass all such modifications and similar structure.

What is claimed is:

1. A pointing device having a computer host, comprising:
   a mother board;
   a CPU (central processing unit), the CPU being coupled to the mother board;
   a memory, being allocated on the mother board, the memory being electrically coupled to the CPU;
   a cursor move device for moving a cursor, the cursor move device being electrically coupled to the CPU;
   a command input device for inputting a command to the CPU, the command input device being electrically coupled to the CPU, and thereby the CPU responding to the command;
   at least one connecting port, being allocated on the mother board, the connecting port being electrically coupled to the CPU;
   a heat sink, the heat sink being on and adjacent to the CPU to dissipate heat generated by the CPU; and
   a housing for encapsulating the mother board, the CPU, the memory and exposing a part of the connecting port, a part of the cursor move device and a part of the command input device, the housing comprises an upper case, the upper case at least has a plurality of air inlets substantially over the heat sink and the CPU and at least one exhaust outlet, via the air inlets, air being introduced to the CPU, via the exhaust outlet, the heat generated by the CPU is exhausted.

2. The pointing device having a computer host according to claim 1, wherein the pointing device is selected from a group consisting of a mouse, a track ball, a mini joystick, a track pad and a touch pad.

3. The pointing device having a computer host according to claim 1, wherein the CPU is coupled to an upper surface of the motherboard via a socket.

4. The pointing device having a computer host according to claim 1, wherein the heat sink comprises a fan.

5. The pointing device having a computer host according to claim 1, wherein the memory comprises an auxiliary memory and a main memory.

6. The pointing device having a computer host according to claim 5, wherein the auxiliary memory is electrically coupled to the CPU via an auxiliary circuit board.

7. The pointing device having a computer host according to claim 5, wherein the main memory is coupled on a lower surface of the mother board.

8. The pointing device having a computer host according to claim 1, wherein the housing further comprises:
   a lower case, the lower case being used to hold the mother board and coupling to the upper case, the upper case being used to cover an upper surface of the mother board, the CPU, the memory being sealed and a part of the connecting port, a part of the cursor move device, a part of the command input device, being exposed.

9. The pointing device having a computer host according to claim 1, wherein the upper case further has a first opening and at least one second opening via the first opening, a part of the cursor move device being exposed, via the second opening, a part of the command input device being exposed.

10. A pointing device having a computer host, comprising:
    a mother board having an upper surface and a lower surface;
    a CPU (central processing unit), the CPU being coupled to the upper surface of the mother board;
    a heat sink, the heat sink being on and adjacent to the CPU to dissipate heat generated by the CPU;
    an auxiliary memory, being allocated on the upper surface of the mother board, the auxiliary memory being electrically coupled to the CPU;
    a main memory, being allocated on the lower surface of the mother board, the main memory being electrically coupled to the CPU;
    a cursor move device for moving a cursor, the cursor move device being electrically coupled to the CPU;
    a command input device for inputting a command to the CPU, the command input device being electrically coupled to the CPU, and thereby the CPU responding to the command;
    at least one connecting port, being allocated on the mother board, the connecting port being electrically coupled to the CPU;
    a lower case, the lower case being used to hold the mother board; and
    an upper case, the upper case being used to cover the upper surface, the upper case having a first opening, at least one second opening, a plurality of air inlets substantially over the heat sink and the CPU and at least one exhaust outlet, via the first opening, the cursor move device being partially exposed, via the second opening, the command input device being partially exposed, via the air inlets, air being introduced to the CPU, via the exhaust outlet, the heat generated by the CPU is exhausted, by coupling the lower case with the upper case to integrate the pointing device and the computer host to form a complete body, and the mother board, the CPU, the main memory being sealed and a part of the connecting port, a part of the cursor move device, a part of the command input device being exposed.

11. The pointing device having a computer host according to claim 10, wherein the pointing device is selected from a group consisting of a mouse, a track ball, a mini joystick, a track pad and a touch pad.

12. The pointing device having a computer host according to claim 10, wherein the CPU is coupled to the mother board via a socket.

13. The pointing device having a computer host according to claim 10, wherein the heat sink comprises a fan.

14. The pointing device having a computer host according to claim 10, wherein the auxiliary memory is electrically coupled to the CPU via an auxiliary circuit board.

* * * * *